United States Patent
Georgakos et al.

(10) Patent No.: US 9,424,124 B2
(45) Date of Patent: Aug. 23, 2016

(54) ERROR-TOLERANT MEMORIES

(71) Applicant: Infineon Technologies AG, Neubiberg (DE)

(72) Inventors: Georg Georgakos, Erding (DE); Michael Goessel, Mahlow (DE); Egor Sogomonyan, Potsdam (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 351 days.

(21) Appl. No.: 13/914,073

(22) Filed: Jun. 10, 2013

(65) Prior Publication Data

US 2013/0339819 A1  Dec. 19, 2013

(30) Foreign Application Priority Data

Jun. 14, 2012  (DE) .......... 10 2012 105 159

(51) Int. Cl.
| | | |
|---|---|---|
| *G11C 29/00* | (2006.01) | |
| *G06F 11/08* | (2006.01) | |
| *H03K 19/003* | (2006.01) | |
| *H03K 19/23* | (2006.01) | |
| *G06F 11/10* | (2006.01) | |

(52) U.S. Cl.
CPC ............ *G06F 11/08* (2013.01); *G06F 11/1008* (2013.01); *H03K 19/0033* (2013.01); *H03K 19/23* (2013.01)

(58) Field of Classification Search
CPC ..... G06F 11/08; G06F 11/1008; H03K 19/23; H03K 19/0033; H03K 19/00338
USPC ..................................... 326/11; 714/763, 797
See application file for complete search history.

(56) References Cited

U.S. PATENT DOCUMENTS

| | | | |
|---|---|---|---|
| 6,496,075 B2* | 12/2002 | Justice et al. ................... 331/11 |
| 6,925,558 B2* | 8/2005 | Kendall ........................ 713/100 |
| 2005/0289441 A1* | 12/2005 | Kawagoe ............ G06F 11/1008 714/763 |
| 2010/0026338 A1* | 2/2010 | Fulcomer ........................ 326/11 |
| 2011/0187907 A1* | 8/2011 | Takahashi ..................... 348/302 |

* cited by examiner

*Primary Examiner* — Guy Lamarre
(74) *Attorney, Agent, or Firm* — Eschweiler & Associates, LLC

(57) ABSTRACT

Methods and apparatuses relating to error-tolerant memories are provided. In one example embodiment, output signals from at least three memory devices are supplied to an error correction device. The error correction device outputs a corrected data value in such a manner that, when the read data values match, this data value is output and, in at least one state in which the data values do not match, a previously output data value is retained.

22 Claims, 9 Drawing Sheets

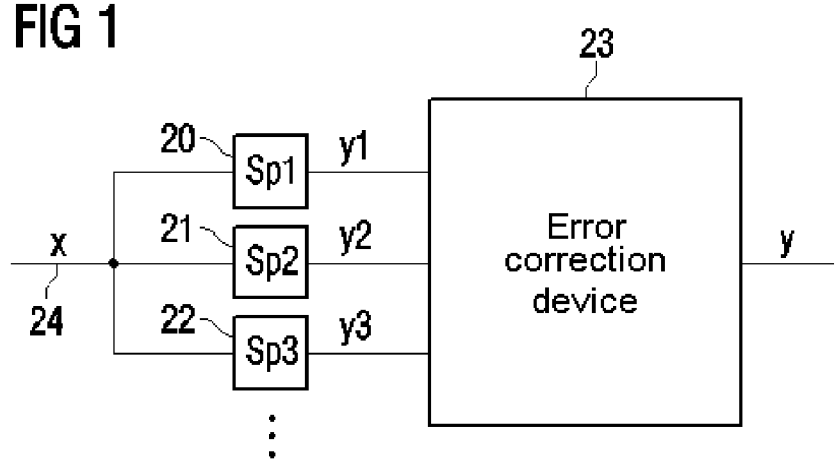
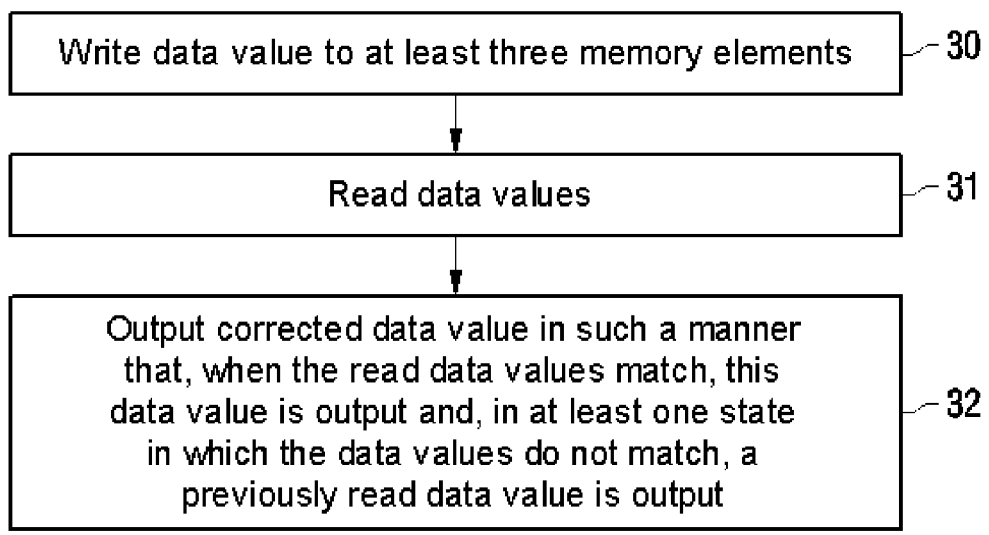

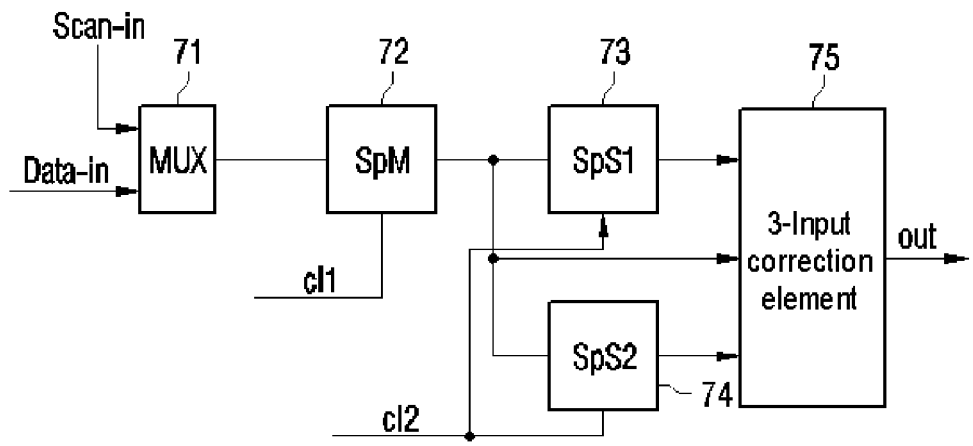
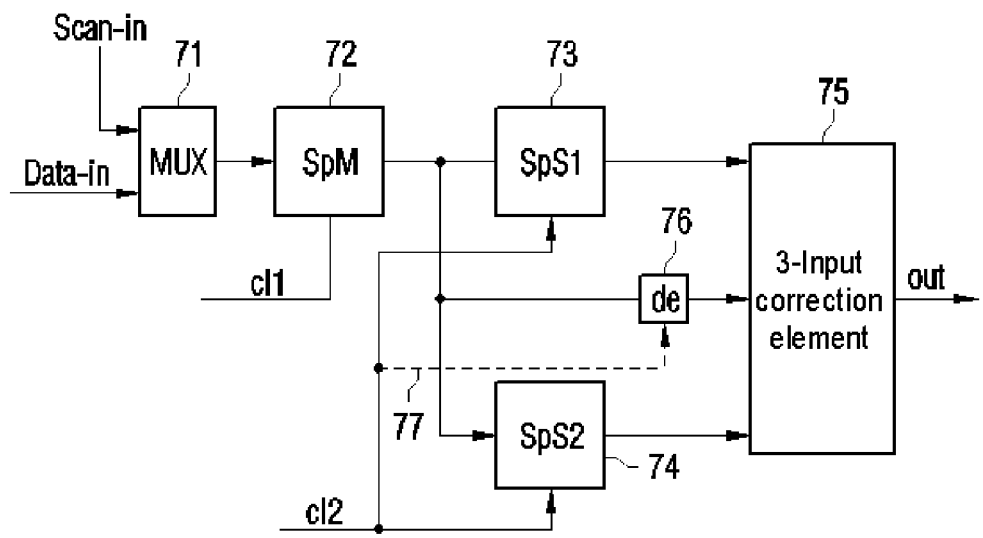
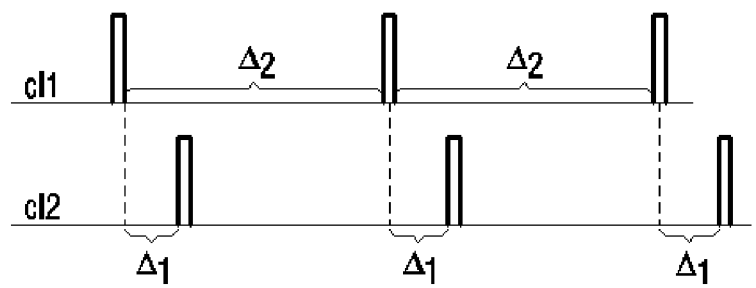

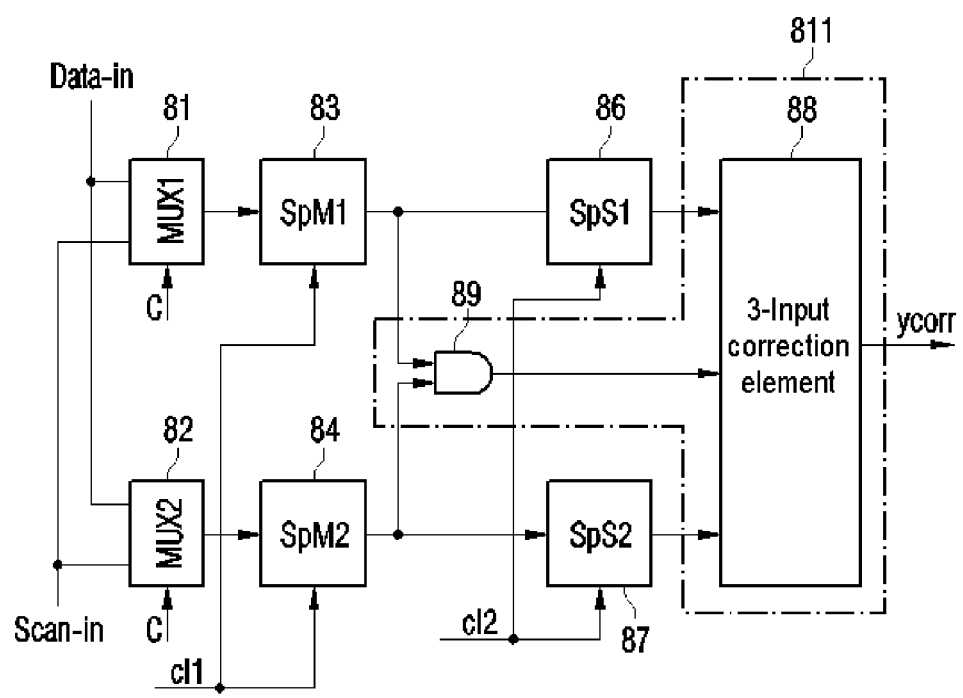

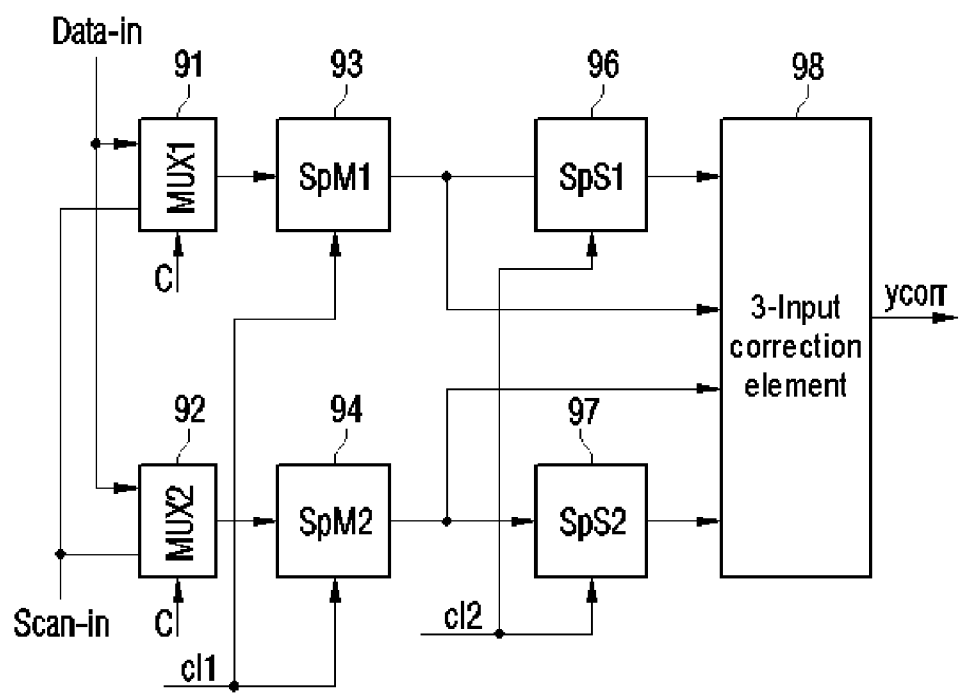

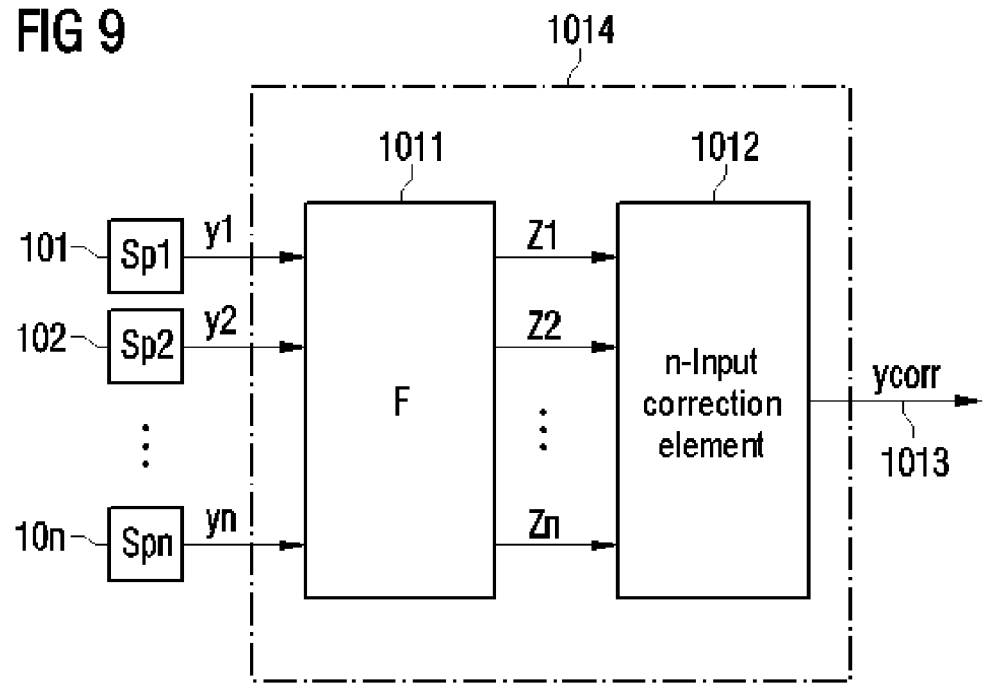
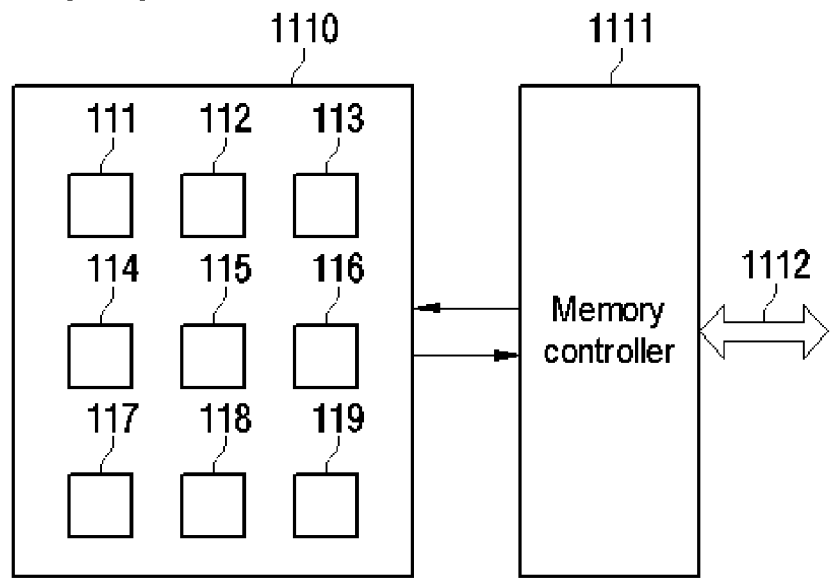

ERROR-TOLERANT MEMORIES

REFERENCE TO RELATED APPLICATIONS

This application claims priority to German Patent Application No. 10 2012 105 159.3, filed on Jun. 14, 2012, which is hereby incorporated by reference in its entirety.

FIELD

The present disclosure relates to error-tolerant memory element arrangements, to memory apparatuses containing such memory element arrangements and to corresponding methods.

BACKGROUND

In electronic devices, memory apparatuses are used to store data, for example programs or user data. Such memory apparatuses typically comprise a multiplicity of memory elements, for example several million memory elements (also referred to as memory cells), in which one bit is respectively typically stored.

Different events, for example, influence of cosmic radiation or other types of X-radiation or ionizing radiation, may change the data stored in such memory elements, which can result in malfunctions. Errors of this type are referred to as radiation errors below.

US 2010/0026338 A1 discloses a memory element arrangement having three or more memory elements. Output values from the memory elements are supplied to a majority decision-maker which then outputs a value which is output by the majority of memory elements.

SUMMARY

The present disclosure provides memory element arrangements, memory apparatuses having such memory element arrangements and corresponding methods which are tolerant to volatile errors such as radiation errors.

One example embodiment provides a memory element arrangement for storing a data value, comprising at least three memory elements, a data input for writing the data value to each of the at least three memory elements, and an error correction circuit having inputs and one output. The arrangement further comprises an output of each of the at least three memory elements being coupled to one of the inputs of the error correction circuit. The error correction circuit is configured, when all of the at least three memory elements output the same value at their output, to provide this value at the output of the error correction circuit and, in at least one state which is independent of a value previously output at the output of the error correction device and in which the at least three memory elements provide at least two different values at their outputs, to retain a value previously output by the error correction circuit.

In some such example embodiments, it is possible to correct at least some cases in which more than half of the at least three memory elements have an error.

In other example embodiments, corresponding methods or memory apparatuses with such memory element arrangements are provided.

BRIEF DESCRIPTION OF THE DRAWINGS

Further example embodiments of the disclosure are explained in more detail below with reference to the accompanying drawings, in which:

FIG. 1 shows a schematic diagram of a memory element arrangement according to one example embodiment, FIG. 2 shows a flowchart of a method according to one example embodiment, FIG. 6A shows a memory element arrangement according to one example embodiment, FIG. 6B shows a modification of the memory element arrangement in FIG. 6A, FIG. 6C shows a diagram for illustrating the method of operation of the memory element arrangement in FIG. 6B, FIG. 7A shows a memory element arrangement according to one example embodiment, FIG. 8 shows a memory element arrangement according to one example embodiment, FIG. 9 shows a memory element arrangement according to one example embodiment, and FIG. 10 shows a memory apparatus according to one example embodiment.

DETAILED DESCRIPTION

Figure 3:
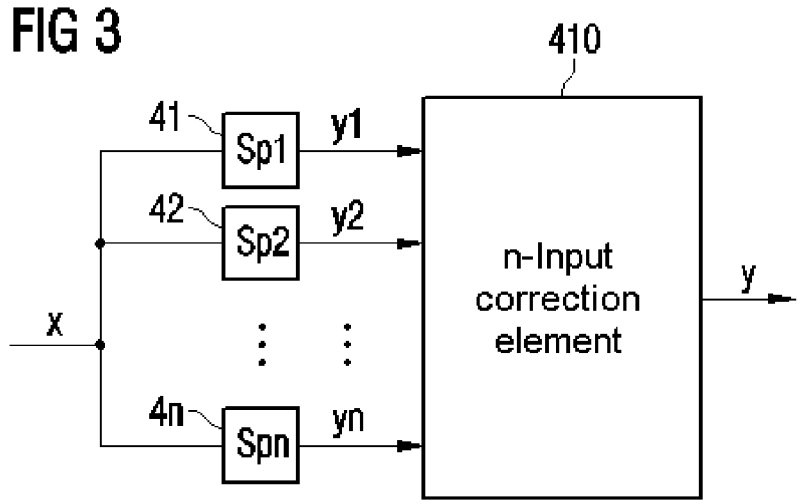
FIG. 3 shows a block diagram of a memory element arrangement according to one example embodiment.

Example embodiments of the disclosure are explained in more detail below with reference to the accompanying drawings. It should be noted that these example embodiments should be understood only as an example and should not be interpreted as restricting the scope of the disclosure.

Features of different example embodiments can be combined with one another, if not explicitly stated otherwise, in order to thus form new example embodiments. On the other hand, a description of an example embodiment having a multiplicity of features should not be interpreted to the effect that all of these features are needed to carry out the disclosure, since other example embodiments may have fewer features and/or alternative features.

Different example embodiments of memory element arrangements are described below. In this case, a memory element arrangement should generally be understood as meaning an arrangement which is used to store a data value. In many of the example embodiments described below, a one-bit data value is used as an example of a data value, that is to say for example a data value which can represent a logic 0 or a logic 1. In principle, however, example embodiments of the disclosure may also be applied to memory element arrangements in which more than one bit, for example a two-bit value, is stored in a memory element.

A memory apparatus in which data can be stored can be constructed from a multiplicity of such memory element arrangements. In this case, the capacity of the memory apparatus depends on the number of memory element arrangements.

As will be explained below, memory element arrangements according to example embodiments often have a multiplicity of, in particular three or more, memory elements in which the data value can be respectively stored. Such memory elements can be implemented in any conventional manner, for example, in the form of a latch, a flip-flop, a register or another type of bistable circuit.

FIG. 1 illustrates a block diagram of one example embodiment of the disclosure. The memory element arrangement in FIG. 1 comprises three or more memory elements 20, 21 and 22. In this case, the number of three memory elements 20-22 illustrated should only be understood as an example, and more than three memory elements may also be provided, as indicated by dots.

A data value x, for example a one-bit value, can be written to each of the memory elements 20-22 via an input 24 of the memory element arrangement. The values read from the memory elements 20-22 are denoted using y1, y2, y3.

If the value x is stored without errors, all values y1-y3 match the previously written value x in this case.

The values y1-y3 read from the memory elements 20-22 are supplied to an error correction device 23 which outputs a value y on the basis of the values y1-y3.

In this case, in the example embodiment in FIG. 1, the error correction device 23 is set up in such a manner that, when the values y1-y3 all match (for example when all values are logic 0 or logic 1 in the case of a one-bit value), it outputs this matching value as the output value y. Furthermore, the error correction device 23 is set up or otherwise configured to output a previously output value as the value y in at least one state in which the values y1-y3 do not match (for example a state in which y1 does not match y2 and y3). The previously output value may be, for example, a value output in a previous clock cycle or a value output in a previous part of the clock cycle. For example, the memory elements 20-22 may be read in a first half of each clock cycle and in a second half of a clock cycle, for example, upon a rising edge and a falling edge of a clock signal, and the value y output in the first half of the clock cycle may continue to be output if the state occurs in the second half of the clock cycle.

In this manner, error correction can also be achieved in some example embodiments when, for example, more than half of the memory elements 20-22 are affected by an error.

It should be noted that, in some example embodiments, there may also additionally be one or more states in which a value determined from the values y1-y3 is output as the value y when the values y1-y3 do not all match. For this purpose, outputs of two memory elements may be combined, in particular, with a logic combination such as a logic AND combination. Corresponding example embodiments for the above cases are explained in more detail later.

FIG. 2 illustrates one example embodiment of a corresponding method. The method in FIG. 2 may be implemented, in particular, in the memory element arrangement in FIG. 1, but may also be used independently thereof.

At 30, a data value, for example a one-bit value, is written to at least three memory elements. At 31, corresponding data values are then read from the at least three memory elements, which data values each match the data value which has been written if an error is not present.

At 32, a corrected data value is output in such a manner that, when the read data values match, this matching data value is output and, in at least one state in which the data values do not match, a previously output data value is output, for example a data value output in a previous half of a clock cycle or a data value output in a previous clock cycle, as explained above.

Different possible ways of implementing the error correction device 23 in FIG. 1 and of implementing the method in FIG. 2 are explained in more detail below with reference to FIGS. 3-9.

FIG. 3 illustrates a memory element arrangement according to another example embodiment of the disclosure. The memory element arrangement in FIG. 3 comprises N=n memory elements 41, 42, ..., 4n, where n≥3 in the example embodiment illustrated. As already explained with reference to FIG. 1, a data value x, for example a one-bit value, can be stored in the memory elements 41, 42, ..., 4n. The values output from the memory elements 41, 42, ..., 4n are denoted using y1, y2, ..., yn and, in the example embodiment in FIG. 3, are supplied to an n-input correction element 410 which is used as an error correction device and outputs a value y on the basis of the values y1, y2, ..., yn. Within the scope of this application, an n-input correction element should be understood as meaning an element having n inputs for inputting data to be corrected. If reference is made below to inputs of an n-input correction element, these inputs are always intended to input data, for example, data which have been read from memory elements. Further inputs which are used for other purposes, for example, for supplying a supply voltage, for example, VDD and ground in the case of a CMOS implementation, may additionally be present and are not explicitly described. If the values supplied to all n inputs match, this matching data value is output as the value y at the output. In contrast, if the data values which have been input include at least two different values, a preceding value, that is to say a previously output value, is output, as explained above.

The method of operation of the n-input correction element is described below.

| y1 | y2 | ... | y(n − 1) | yn | y |
|---|---|---|---|---|---|
| 0 | 0 | ... | 0 | 0 | 0 |
| 0 | 0 | ... | 0 | 1 | preceding value |
| 0 | 0 | ... | 1 | 0 | preceding value |
| . | . | . | . | . | preceding value |
| . | . | . | . | . | |
| . | . | . | . | . | |
| 1 | 1 | ... | 1 | 0 | preceding value |
| 1 | 1 | ... | 1 | 1 | 1 |

The n-input correction element outputs the value y=0 if y1=y2= ... =yn=0 is input and outputs the value y=1 if y1=y2= ... =yn=1 is input. In all other cases, the n-input correction element outputs the preceding value.

The memory element arrangement of the example embodiment in FIG. 3 allows up to n−1 volatile errors, which affect the output of up to n−1 of the memory elements in a second clock half for example, to be corrected. In this case, volatile errors are errors which affect an instantaneously stored value but do not adversely affect the fundamental functionality of the affected memory elements.

If y1=y2= ... =yn=1 in the first clock half for example, y=1 in this clock half. If at most n−1 memory elements are now disrupted to the value 0 in the second clock half, for instance as a result of a radiation error, the corrected value y=1 is also output in the second clock half even though up to n−1 memory elements assume an incorrect value in the second clock half.

Figure 4:
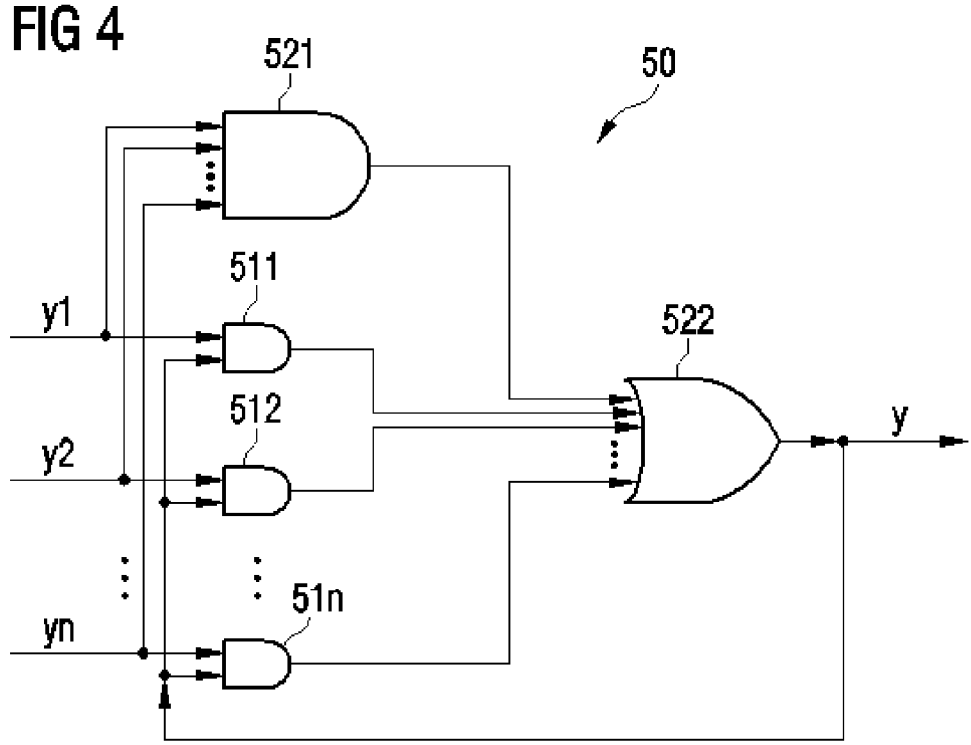
FIG. 4 shows a logic diagram of a correction element which can be used in example embodiments of the disclosure.

FIG. 4 illustrates one possible implementation of such an n-input correction element according to one example embodiment.

For i=1, ..., n, an input line carrying the signal yi, for example the data value read from the ith memory elements, is connected to a first input of an AND gate 511 (511, 512, ..., 51n in FIG. 4), which has two inputs and one output, and also to an ith input of an AND gate 521 having n inputs and one output. For i=1, ..., n, the output of the AND gate 511 is connected to the (i+1)th input of an OR gate 522 having n+1 inputs and one output, to the first input of which the output of the AND gate 521 is passed. An output of the OR gate 522, which carries the corrected value y, is connected to the respective second input of the AND gates 511, 512, ..., 51n. The method of operation of the circuit from FIG. 4 shall now be explained.

If y1=y2=...=yn=0, the values on the output lines of the AND gates 521, 511, 512, ... 51n are all equal to 0, thus resulting in y=0. If y1=y2=...=yn=1, the AND gate 521 outputs the value 1, which is why the output of the OR gate 522 likewise has the value 1 and y=1.

If not all of the values y1, y2, ..., yn are now the same as one another, the output value y does not change. This is explained for the case in which y1=1 and y2=0.

If y=1, the value output by the AND gate 511 is equal to 1. This value is passed to the second input of the OR gate 522 which therefore outputs, at its output, the value y=1 which has not changed.

If now y=0, the values output by the AND gates 521, 511, 512, ... 51n (n+1) are each equal to 0. These n+1 values which are all equal to 0 are forwarded to the inputs of the OR gate 522 which then outputs the value 0, with the result that the value y at the output of this gate does not change.

Figure 5:
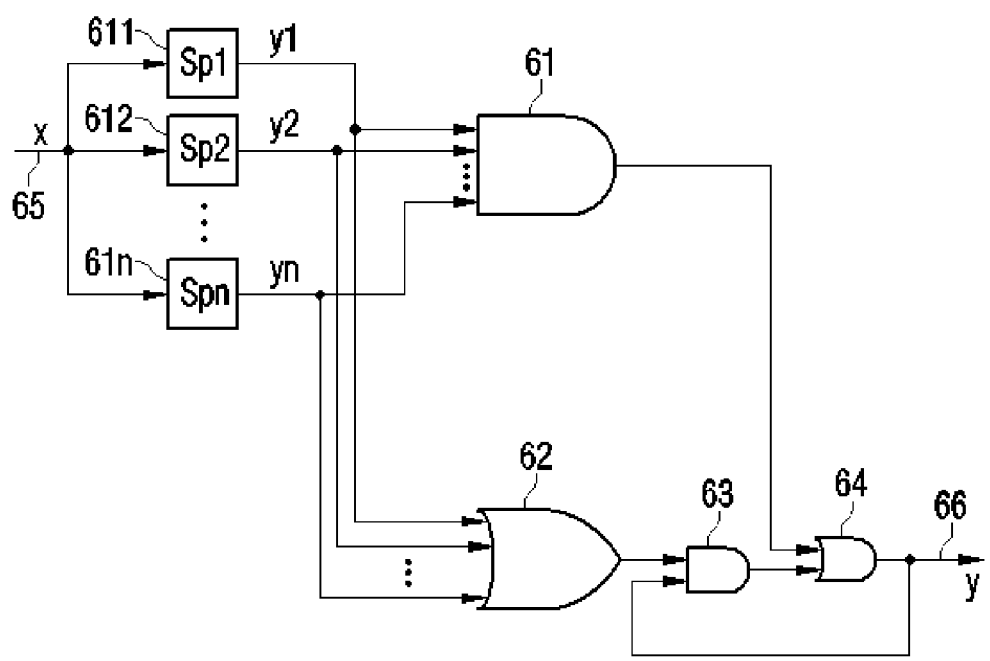
FIG. 5 shows a memory element arrangement according to one example embodiment.

FIG. 5 shows another possible example embodiment of an n-input correction element whose n input lines carrying the values y1, y2, ..., yn are connected, for example, to n memory elements Sp1 611, Sp2 212, ... Sp n.

For i=1, ..., n, the output of the memory element Spi 61i, which carries the signal yi, is connected both to an ith input of an AND gate 61, which has n inputs and one output, and to an ith input of an OR gate 62 which has n inputs and one output. An output of the OR gate 62 is connected to a first input of an AND gate 63 which has two inputs and one output and the output of which is passed to the first input of an OR gate 64 which has two inputs and one output and the second input of which is connected to the output of the AND gate 61. The output 66 of the OR gate 64, which carries the corrected value y, is fed back to the second input of the AND gate 63.

For i=1, ..., n, the memory elements Spi 61i are all connected to the same input line 65 carrying the data value x to be stored, with the result that the same value is stored in each of the memory elements Spi 61i if there are no errors.

The method of operation of the circuit arrangement from FIG. 5 shall now be explained.

If y1=y2=...=yn=0, both the AND gate 61 and the OR gate 62 output the value 0, with the result that the values 0 are present at the two inputs of the OR gate 64 and also result in the value y=0 at the output 66. If y1=y2=...=yn=1, the OR gate 62 outputs the value 1. The value 1 is therefore present at the first input of the OR gate 64 and also results in the value y=1 at the output 66.

For the purpose of a description which is as simple as possible, it is now assumed, by way of example, that n=3, and the behavior in the event of an error in the two memory elements Sp2 and Sp3 is described.

For the purpose of explanation, the correct value which is output, for example, in a first clock half by all three memory elements is equal to 1, with the result that y1=y2=y3=1 in the first clock half. The output 66 of the correction element carrying the value y then outputs the value 1 in the first clock half. In a second clock half, y1=1 and incorrectly y2=y3=0, for example. In the second clock half, the AND gate 61 then outputs the value 0 and the OR gate 62 outputs the value 1 which is present at the first input of the AND gate 61, to the second input of which the output 66 carrying the value y=1 is fed back. The values 1 are therefore each present at the two inputs of the AND gate 63 in the second clock half, with the result that the output of this gate also carries the value 1 which is connected to the first input of the OR gate 64. The output value y=1 of the output 66 therefore also remains stable at 1 in the second clock half and the output value remains correct even though a two-bit error is present in the memory elements. In a corresponding manner, it is possible to check that each error of m memory elements is correctly corrected in the second clock half, with m≤n−1.

FIGS. 4 and 5 show only two possible examples of the implementation of an n-input correction element; it goes without saying that other implementations are also possible using other arrangements of logic gates. n-Input correction elements can also be implemented by means of transistors, with the result that such an implementation can also be described at the transistor level, in which case the same functionality as that achieved by the logic gates illustrated in FIGS. 4 and 5 can fundamentally be achieved.

In the previously described example embodiments, there was no special relationship between the memory elements, apart from the fact that they were used to store an identical value. In some example embodiments, memory elements may have a master/slave relationship, slave memory elements receiving the data to be stored via one or more corresponding master memory elements, rather than directly from an input. Corresponding example embodiments are now described with reference to FIGS. 6-8.

FIG. 6A shows a circuit arrangement according to the disclosure in which the outputs of three memory elements SpM 72, SpS1 73 and SpS2 74 are connected to the inputs of a three-input correction element 75, the different memory elements being masters or slaves of a master/slave flip-flop. The three-input correction element 75 can be implemented as explained above. The memory element SpM 72 is the master latch with the clock signal cl1, and the memory element SpS1 73 and the memory element SpS2 74 have the functions of a slave latch with the clock signal cl2.

A multiplexer MUX 71, to the inputs of which, depending on the selected mode, a scan-in signal is input in a scan mode, that is to say a test operating mode, or a data-in signal is input in the normal operating mode, is connected upstream of the memory element SpM 72. Depending on the selected mode, the scan-out value or the data-out value is output at the output out of the three-input correction element. In another example embodiment, the multiplexer MUX 71 may also be omitted in order to implement a test operating mode. In such a case, the data-in signal may also be directly applied to the memory element SpM 72, for example.

The error correction of a data value stored in the three memory elements 72, 73 and 74 by means of the three-input correction element 75 can then take place in the manner described above, for example, for the example embodiment in FIG. 4 or FIG. 5.

The use of a master/slave arrangement of memory elements may result in delays in some cases. For example, the situation may occur in which a data value is stored later in a slave memory element than in the master memory element as a result of a delay caused by a master memory element. In this case, it is possible to provide delay elements in order to ensure, for example, that the outputs of all memory elements are provided at an error correction device, such as an n-input correction element, at the same time.

FIG. 6B illustrates a corresponding example embodiment. The example embodiment in FIG. 6B substantially corresponds to the example embodiment in FIG. 6A, with the result that only the differences are explained below.

In contrast to FIG. 6A, a delay element 76 is provided between an output of the memory element SpM 72 and one of three inputs of the three-input correction element 75 in the example embodiment in FIG. 6B. In the example embodiment in FIG. 6B, the delay of the delay element 76 is selected here in such a manner that the outputs of the memory elements 72-74 are provided to the three-input correction element 75 in a synchronous manner.

The delay required for this purpose shall now be explained with reference to FIG. 6C. As schematically illustrated in FIG. 6C, the individual clock pulses or clock edges of the clock signal cl1 have a spacing of $\Delta_2$ from one another. The clock pulses or clock edges of the clock signal cl2 are offset by $\Delta_1$ with respect thereto.

In order to achieve the situation in which all output values of the memory elements 72-74 are supplied to the three-input correction element 75 in a synchronous manner, the delay element 76 is provided with a corresponding delay in the example embodiment in FIG. 6B such that the clock offset of cl2 with respect to cl1 of $\Delta_1$ and the delay of the memory elements 73 and 74 are taken into account. In another example embodiment which is a modification of FIG. 6B, this can be achieved, for example, by optionally supplying 77 (illustrated using dashed lines in FIG. 6B) the clock signal cl2 to the delay element 76.

In the example embodiments in FIGS. 3 to 6, a number of memory cells corresponds to a number of inputs of an n-input correction element which is used as the error correction device. In other example embodiments, an n-input correction element having a number of inputs n which is smaller than the number of memory cells N may be provided as the error correction device. Example embodiments of this are now explained with reference to FIGS. 7A-7D.

FIG. 7A shows a memory element arrangement according to one example embodiment with N=4 memory elements SpM1 83, SpS1 86, SpM2 84, SpS2 87 and an error correction device 811 comprising a three-input correction element 88, with the result that n=3 here.

A multiplexer MUX1 81, the memory element SpM1 83 and the memory element SpS1 86 form a first master/slave flip-flop, where SpM1 83 is the master latch and SpS1 86 is the slave latch of this first master/slave flip-flop. A multiplexer MUX2 82, the memory element SpM2 84 and the memory element SpS2 87 form a second master/slave flip-flop, where SpM2 84 is the master latch and SpS2 87 is the slave latch of this second master/slave flip-flop. In this case too, the multiplexers MUX1 81 and/or MUX2 82 may be omitted in other example embodiments. In this case, it is also possible for only one of the two multiplexers 81, 82 to be used and, in the case of the memory element 83 or 84 which does not have a multiplexer connected upstream of it, for the data-in signal to be directly passed to the memory element.

The memory elements SpM1 83 and SpM2 84 are connected to a first clock signal cl1, while the memory elements SpS1 86 and SpS2 87 are connected to a second clock signal cl2, corresponding to a conventional configuration of a master/slave flip-flop.

The input data-in, which carries a data signal to be stored, or the input scan-in, which carries a signal to be scanned in, is connected to the data inputs of the memory elements SpM1 and SpM2 via the multiplexers MUX1 81 and MUX2 82 on the basis of a binary control signal c.

In the example embodiment in FIG. 7A, the error correction device 811 also comprises an AND gate 89. An output (data output) of the memory element SpM1 83 is passed both to an input (data input) of the memory element SpS1 86 and to a first input of the AND gate 89 with two inputs and one output. An output of the memory element SpM2 84 is passed both to an input of the memory element SpS2 87 and to a second input of the AND gate 89.

The output of the memory element SpS1 86 is connected to a first input of the three-input correction element 88. An output of the memory element SpS2 87 is connected to a second input of the three-input correction element 88, while an output of the AND gate 89 is connected to the third input of the three-input correction element which outputs a corrected value y at its output. The AND gate 89 implements the Boolean function $g(x1, x2)=x1\char`\^x2$, for which $g(0, 0)=0\neq1=g(1, 1)$, and $g(0, 1)=g(1, 0)=0$.

The error correction for one-bit, two-bit and three-bit errors will now be described for the memory element arrangement from FIG. 7A. Such errors may arise, for example, in a waiting state of the memory element arrangement. In this case, a waiting state should be understood as meaning a state in which a longer period of time, for example many clock cycles, in which the memory elements which are in a waiting state are not clocked may lie between a time at which a data value is written to the memory elements and a time at which the data value is required and is read out for this purpose. This longer period of time increases, for example, the likelihood of an error, for example a radiation error, occurring between writing and reading. Such waiting states occur, for example, in memory element arrangements to which data are written once when starting up a system, for example data read from a so-called fuse or another permanent memory, such as calibration data or error information relating to a memory arrangement.

The situation in which there is no error is considered first of all.

If, for example, at the time at which the clock signals are cl1=1 and cl2=0, a data value of 1 is now written to the memory elements SpM1 83 and SpM2 84 via the multiplexers MUX1 81 and MUX2 82, the value 1 is respectively present at the output of the memory elements SpS1 86 and SpS2 87, SpM1 83, SpM2 84 and at the output of the AND gate 89 and thus at all three inputs of the three-input correction element 88, which then outputs the value 1 at its output, when the clock signals are cl1=0 and cl2=1.

If a transient one-bit error now occurs, for example, at the output of the memory element SpM1 83 if the clock signals still assume the values cl1=0 and cl2=1 and the system is in a waiting state, for example, which error corrupts the output value 1 to 0, the error-free value 1 at the output of the AND gate 89 incorrectly changes to 0, with the result that the values 1, 0, 1 are present at the three inputs of the three-input correction element 88, and the correct value 1 is retained at the output of the three-input correction element.

Two-bit errors are now considered as further errors. If a transient error occurs simultaneously at the output of the memory element SpM1 83 and at the output of the memory element SpM2 84 if the clock signals still assume the values cl1=0 and cl2=1 and the system is in a waiting state, for example, which error respectively corrupts the output value 1 to 0, the error-free value 1 at the output of the AND gate 89 incorrectly changes to 0, with the result that the values 1, 0, 1 are present at the three inputs of the three-input correction element 88, and the correct value 1 is retained at the output of the three-input correction element.

If a transient error occurs simultaneously at the output of the memory element SpM1 83 and at the output of the memory element SpS1 86 if the clock signals still assume the values cl1=0 and cl2=1 and the system is in a waiting state, for example, which error respectively corrupts the output value 1 to 0, the error-free value 1 at the output of the AND gate 89 incorrectly changes to 0 and the error-free value 1 at the output of the memory element SpS1 86 changes to the incorrect value 0, with the result that the values 0, 0, 1 are present at the three inputs of the three-input correction element 88, and the correct value 1 is retained at the output of the three-input correction element.

It is accordingly possible to be convinced that any transient two-bit error which occurs, for example, in a waiting state with cl1=0 and cl2=1 is corrected by the circuit arrangement.

Three-bit errors shall now be considered as further errors. In this case, the situation in which the value 1 is written to the memory elements SpM1 83 and SpM2 84 via the multiplexers MUX1 81 and MUX2 82 at the time at which the clock signals are cl1=1 and cl2=0 is still considered. In the error-free case, if the clock signals are cl1=0 and cl2=1, the value 1 is respectively present at the output of the memory elements SpS1 86 and SpS2 87, SpM1 83, SpM2 84 and at the output of the AND gate 89 and thus at all three inputs of the three-input correction element 88 which then outputs the value 1 at its output.

If a transient error occurs simultaneously at the output of the memory element SpM1 83, at the output of the memory element SpM2 84 and at the output of the memory element SpS1 86 if the clock signals still assume the values cl1=0 and cl2=1 and the system is in a waiting state, for example, which error respectively corrupts the output value 1 to 0, the error-free value 1 at the output of the AND gate 89 incorrectly changes to 0 and the error-free value 1 at the output of the memory element SpS1 86 changes to the incorrect value 0, with the result that the values 0, 0, 1 are present at the three inputs of the three-input correction element 88, and the correct value 1 is retained at the output of the three-input correction element. If a transient error occurs simultaneously at the output of the memory element SpM1 83, at the output of the memory element SpS1 86 and at the output of the memory element SpS2 87 if the clock signals still assume the values cl1=0 and cl2=1 and the system is in a waiting state, for example, which error respectively corrupts the output value 1 to 0, the error-free value 1 at the output of the AND gate 89 incorrectly changes to 0, the error-free value 1 at the output of the memory element SpS1 86 changes to the incorrect value 0 and the error-free value 1 at the output of the memory element SpS2 87 changes to the incorrect value 0, with the result that the values 0, 0, 0 are present at the three inputs of the three-input correction element 88, and the correct value 1 at the output of the three-input correction element is corrupted to the incorrect value 0. This is an example of a state in which the same value is not supplied to all inputs of the error correction device 811, but a previously output value does not continue to be output.

Another example of a situation emerges if, in the error-free case, the value 0 is written to the memory elements SpM1 83 and SpM2 84 via the multiplexers MUX1 81 and MUX2 82 at the time at which the clock signals are cl1=1 and cl2=0. If the clock signals are cl1=0 and cl2=1, the value 0 is respectively present at the output of the memory elements SpS1 86 and SpS2 87, SpM1 83, SpM2 84 and at the output of the AND gate 89 and thus at all three inputs of the three-input correction element 88 which then outputs the value 0 at its output.

If a transient error now occurs simultaneously at the output of the memory element SpM1 83, at the output of the memory element SpS1 86 and at the output of the memory element SpS2 87 if the clock signals still assume the values cl1=0 and cl2=1 and the system is in a waiting state, for example, which error respectively corrupts the output value 0 to 1, the error-free value 0 at the output of the AND gate 89 does not change. The error-free value 0 at the output of the memory element SpS1 86 and the error-free value 0 at the output of the memory element SpS2 87 change to the incorrect value 1, with the result that the values 1, 0, 1 are present at the three inputs of the three-input correction element 88, and the correct value 0 is output at the output of the three-input correction element.

In this manner, it becomes clear that, in the example embodiment in FIG. 7A, at least a subset of the three-bit errors is correctly corrected, while all two-bit errors and one-bit errors are correctly corrected.

In particular, it is clear from the above that, in the circuit arrangement from FIG. 7A, all three-bit errors which each corrupt correct values 0 to 1 are reliably detected.

Figure 7B:
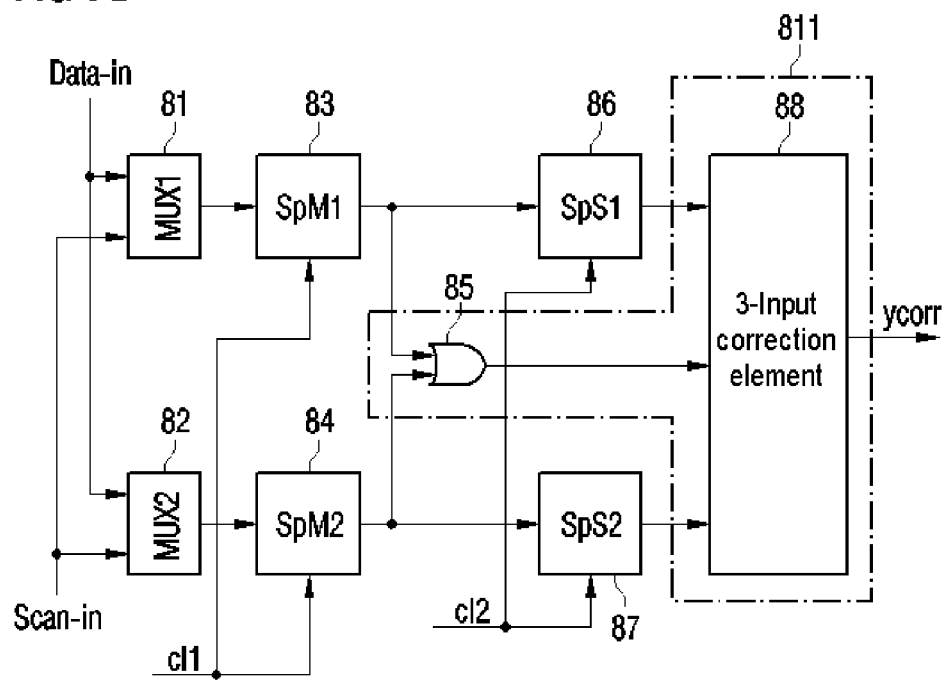
FIG. 7B shows a modification of the example embodiment in FIG. 6A.

In the example embodiment in FIG. 7A, the outputs of the memory elements 83 and 84 are combined using the AND gate 89. However, other logic circuits, for example OR gates, NAND gates or NOR gates, can also be used for such a purpose. FIG. 7B illustrates a corresponding example embodiment.

The circuit arrangement from FIG. 7B differs from the circuit arrangement in FIG. 7A in that the AND gate 89 in FIG. 7A has been replaced with an OR gate 85 in FIG. 7B. The same circuit parts in FIG. 7A and FIG. 7B are marked with the same reference symbols and their description is not repeated here again.

In FIG. 7B, the data output of the memory element SpM1 83 is passed both to the data input of the memory element SpS1 86 and to a first input of the OR gate 85 having two inputs and one output. The data output of the memory element SpM2 84 is passed both to the data input of the memory element SpS2 87 and to the second input of the OR gate 85.

The data output of the memory element SpS1 86 is connected to the first input of the three-input correction element 88. The data output of the memory element SpS2 87 is connected to the second input of the three-input correction element 88, while the output of the OR gate 85 is connected to the third input of the three-input correction element 88 which outputs the corrected value y at its output. The OR gate 85 implements the Boolean function $g(x1, x2)=x1 \vee x2$, for which $g(0,0)=0 \neq 1=g(1,1)$ and $g(0,1)=g(1,0)=1$.

The error correction by the memory element arrangement from FIG. 7B is similar to the error correction in the memory element arrangement from FIG. 7A, as can be easily checked. Like in the circuit arrangement from FIG. 7A, it is seen that all one-bit errors and all two-bit errors are correctly corrected, for example, in a waiting state with cl1=0 and cl2=1. The correction of the three-bit error which could not be corrected in the circuit arrangement from FIG. 7A is now examined.

The situation in which the value 1 is written to the memory elements SpM1 83 and SpM2 84 via the multiplexers MUX1 81 and MUX2 82 at the time at which the clock signals are cl1=1 and cl2=0 is examined. In the error-free case, if the clock signals are cl1=0 and cl2=1, the value 1 is then respectively present at the output of the memory elements SpS1 86 and SpS2 87 and at the output of the OR gate 85 and thus at all three inputs of the three-input correction element 88 which then outputs the value 1 at its output. If a transient error now occurs simultaneously at the output of the memory element SpM1 83, at the output of the memory element SpS1 86 and at the output of the memory element SpS2 87 if the clock signals still assume the values cl1=0 and cl2=1 and the system is in a waiting state, for example, which error respectively corrupts the output value 1 to 0, the error-free value 1 at the output of the OR gate 85 does not change. The error-free value 1 at the output of the memory element SpS1 86 and the error-free value 1 at the output of the memory element SpS2 87 are each corrupted to the incorrect value 0, with the result that the values 0, 1, 0 are present at the three inputs of the three-input correction element 88, and the correct value 1 is output at the output of the three-input correction element. Every three-bit error which corrupts correct values 1 to 0 is corrected by the circuit arrangement from FIG. 7B. This can be checked by considering all four three-bit errors of this type in the same manner. If a correct value 0 is disrupted to an incorrect value 1 more often than a correct value 1 is disrupted to an incorrect value 0, the memory element arrangement from FIG. 7A, for example, can be used.

If a correct value 1 is disrupted to an incorrect value 0 more often than a correct value 0 is disrupted to an incorrect value 1, the memory element arrangement from FIG. 7B, for example, can be used. This makes it possible to correctly correct a larger number of three-bit errors. However, it goes without saying that it is possible, in principle, to use both the memory element arrangement from FIG. 7A and the memory element arrangement from FIG. 7B in any case.

Figure 7C:
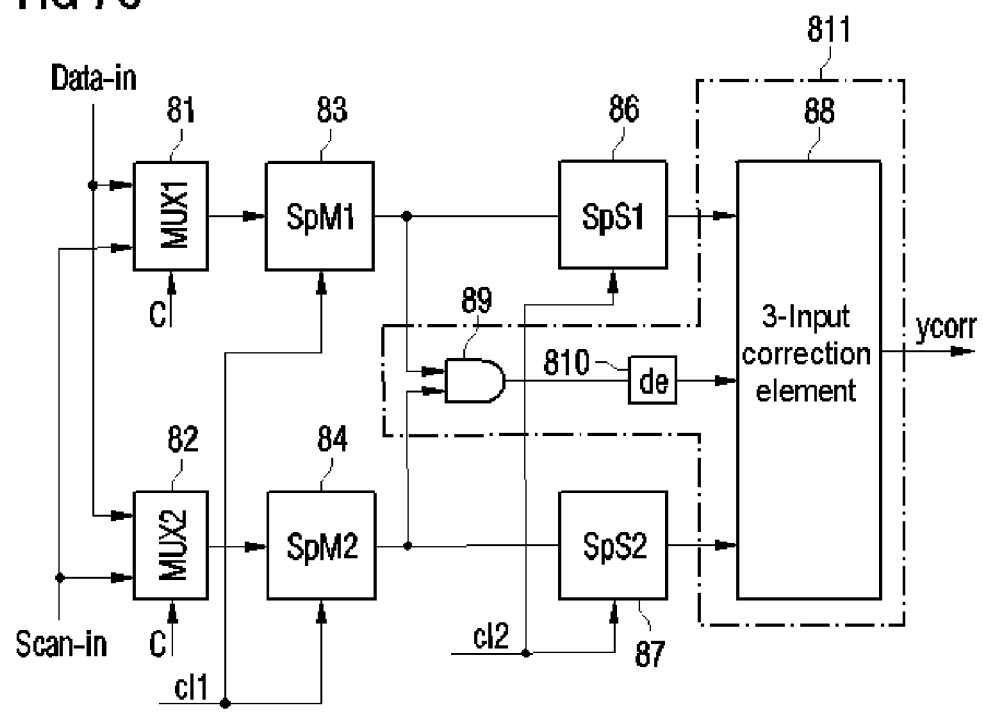
FIG. 7C shows another modification of the example embodiment in FIG. 7A.

As already explained for the situation in FIG. 6A, the use of master memory elements and slave memory elements may result in delays. As explained for the circuit arrangement in FIG. 6A with reference to FIG. 6B, corresponding delay elements can also be used for the circuit arrangements in FIGS. 7A and 7B in order to ensure that all output values are present at the three-input correction element 88 at a desired time. FIG. 7C illustrates an example which modifies the example embodiment in FIG. 7A.

Here, a delay element 810 is provided downstream of the AND gate 89. In a similar manner, a delay element can also be connected downstream of the OR gate 85 in the example embodiment in FIG. 7B. In other example embodiments, corresponding delay elements can be provided upstream of inputs of the AND gate 89 or of the OR gate 85.

Figure 7D:
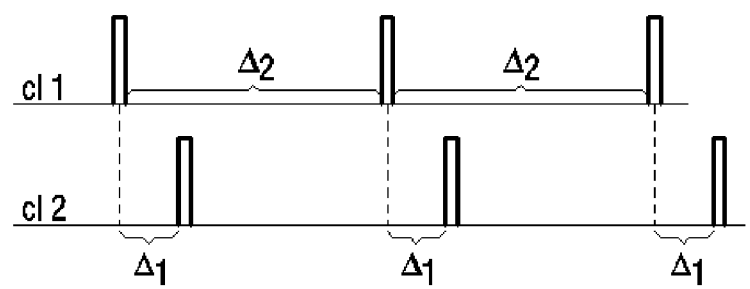
FIG. 7D shows a diagram for illustrating the method of operation of the example embodiment in FIG. 7C.

FIG. 7D illustrates a diagram which substantially corresponds to the diagram in FIG. 6C and shows a clock offset $\Delta_1$ which can be compensated for, for example, by means of the delay element 810 in FIG. 7C.

In the example embodiments in FIGS. 7A-7C, the outputs of the memory elements 83 and 84 are combined by means of a logic gate 89 or 85 and are supplied to an input of a three-input correction element 88. In other example embodiments, a separate input of an n-input correction element may be provided for each memory element in a similar manner to the example embodiment in FIG. 3. FIG. 8 illustrates a corresponding example embodiment.

FIG. 8 shows a memory element arrangement according to another example embodiment with N=4 memory elements SpM1 93, SpS1 96, SpM2 94, SpS2 97 and a four-input correction element 98, with the result that n=4 here.

A multiplexer MUX1 91, the memory element SpM1 93 and the memory element SpS1 96 form a first master/slave flip-flop, where SpM1 93 is the master latch and SpS1 96 is the slave latch of this first master/slave flip-flop. A multiplexer MUX2 92, the memory element SpM2 94 and the memory element SpS2 97 form a second master/slave flip-flop, where SpM2 94 is the master latch and SpS2 97 is the slave latch of this second master/slave flip-flop. In this case too, the multiplexers MUX1 91 and/or MUX2 92 may be omitted in other example embodiments, as explained above.

The memory elements SpM1 93 and SpM2 94 are connected to a first clock signal cl1, while the memory elements SpS1 96 and SpS2 97 are connected to a second clock signal cl2, corresponding to a conventional master/slave flip-flop.

The input data-in, which carries a data signal to be stored, or the input scan-in, which carries the signal to be scanned in, is connected to the data inputs of the memory elements SpM1 and SpM2 via the multiplexers MUX1 91 and MUX2 92 on the basis of a binary control signal c.

An output of the memory element SpM1 93 is passed both to an input of the memory element SpS1 96 and to a first input of the four-input correction element. An output of the memory element SpM2 94 is passed both to an input of the memory element SpS2 97 and to a second input of the four-input correction element 98.

An output of the memory element SpS1 96 is connected to a third input of the four-input correction element 98. An output of the memory element SpS2 97 is connected to a fourth input of the four-input correction element 98 which outputs a corrected value $y_{corr}$ at an output.

The error correction of the memory element arrangement in FIG. 8 shall be described here for a three-bit error.

The situation in which there is no error is again considered first of all.

If, at the time at which the clock signals are cl1=1 and cl2=0, the value 1 is written to the memory elements SpM1 93 and SpM2 94 via the multiplexers MUX1 91 and MUX2 92, the value 1 is respectively present at the output of the memory elements SpS1 96 and SpS2 97, SpM1 93, SpM2 94 and thus at all four inputs of the four-input correction element 98, which then outputs the value 1 at its output, when the clock signals are cl1=0 and cl2=1.

If a transient error now occurs at the output of the memory elements SpM1 93, SpM2 94 and SpS1 96 if the clock signals still assume the values cl1=0 and cl2=1 and the system is in a waiting state, for example, which error corrupts the output value 1 to 0, the incorrect value 0 is respectively present at the first, second and third inputs of the four-input correction element 98, while the correct value 1 is present at its fourth input. Since not all input values of the four-input correction element 98 are the same, this element outputs, at its output, the correct value 1 which it has previously output. This is also the case if the individual errors cited occur in temporal succession if the system is in a waiting state, for example.

As already clear from the example embodiments in FIGS. 6 and 7, an error correction device according to the disclosure may comprise an n-input correction element, where n may be less than or equal to the number of memory elements N. In the case of N memory elements, a combinational circuit which supplies N outputs of memory cells to n inputs of an n-input correction element may generally be connected upstream of an n-input correction element. Examples of such combinational circuits are the abovementioned AND and OR gates. FIG. 9 illustrates another corresponding example embodiment.

FIG. 9 shows a memory element arrangement according to the disclosure comprising N memory elements Spi 10*i*, $i=1, \ldots, N$, which output values yi at their respective output and are connected to N inputs of a logic circuit in the form of a combinational circuit 1011 for implementing a combinational function F with N binary inputs and n binary outputs which carry the values zj, where $j=1, \ldots, n$. In this case, $n \geq 3$ and $N \geq n$. The n binary outputs of the combinational circuit 1011 are connected to n binary inputs of an n-input correction element 1012 which outputs a corrected output signal ycorr at its binary output 1013. In this case, an error correction device 1014 comprises the combinational circuit 1011 and the n-input correction element 1012. It should be noted that, in other example embodiments, at least one of the n outputs of the combinational circuit 1011 may be connected to the respectively associated input of the n-input correction element 1012 via a delay element, for example in order to achieve synchronous, in particular simultaneous, provision of corresponding input values for the n-input correction element 1012 in a similar manner to that described for FIGS. 6B and 7C.

The combinational circuit 1011 transforms the binary values y1, ..., yN present at its N inputs into the values z1, ..., zn output at its n outputs $$z1, \ldots, zn = F(y1, \ldots, yN).$$

In one example embodiment, the combinational circuit 1011 is designed in such a manner that:
1. if $$y1, \ldots, yN = \underbrace{0, \ldots, 0}_{N}$$

is input, the combinational circuit 1011 outputs the values $$F(\underbrace{0, \ldots, 0}_{N}) = \underbrace{0, \ldots, 0}_{n} = z1, \ldots zn,$$

2. if $$y1, \ldots, yN = \underbrace{1, \ldots, 1}_{N}$$

is input, the combinational circuit 1011 outputs the values $$F(\underbrace{1, \ldots, 1}_{N}) = \underbrace{1, \ldots, 1}_{n} = z1, \ldots zn,$$

3. if a binary sequence y1, ..., yN containing at least one 1 and at most k ones is input to the combinational circuit 1011, the binary sequence z1, ..., zn=F(y1, ..., yN) output by the combinational circuit 1011 contains at least one 1 and at least one 0. In this case, 2≤k≤N−1,
4. if a binary sequence y1, ..., yN containing at least one 0 and at most k zeros is input to the combinational circuit 1011, the binary sequence z1, ..., zn=F(y1, ..., yN) output by the combinational circuit 1011 contains at least one 1 and at least one 0.

The method of operation of the n-input correction element 1012 corresponds to the method of operation already explained and is illustrated again in the following table.

| z1 | z2 | ... | z(n − 1) | zn | $y_{corr}$ |
|----|----|----|----|----|----|
| 0 | 0 | ... | 0 | 0 | 0 |
| 0 | 0 | ... | 0 | 1 | preceding value |
| 0 | 0 | ... | 1 | 0 | preceding value |
| . | . | . | . | . | preceding value |
| . | . | . | . | . |  |
| . | . | . | . | . |  |
| 1 | 1 | ... | 1 | 0 | preceding value |
| 1 | 1 | ... | 1 | 1 | 1 |

The n-input correction element 1012 outputs the value y=0 if y1=y2= ... =yn=0 is input and outputs the value y=1 if y1=y2= ... =yn=1 is input. In all other cases, the n-input correction element outputs the preceding value.

This memory element arrangement allows up to k volatile errors, which affect the output of up to k of the memory elements in a second clock half for example, to be corrected, where k is at least equal to 2 and is at most equal to n−1, depending on the example embodiment.

If y1=y2= ... =yN=1 in a first clock half for example, (z1, z2, ..., zn)=F(1, ..., 1)=1, ..., 1 and thus y=1 in this clock half. If at most k memory elements are now disrupted to the value 0 in a second clock half, for instance as a result of a radiation error, the combinational circuit 1011 maps the input values y1, ..., yN to output values z1, ..., zn=F(y1, ..., yN), with the result that at least one component of these values is equal to zero and at least one component is equal to 1, with the result that not all components z1, ..., zn are the same. If these values are input, the n-input correction element 1012 outputs the preceding value 1 at its output, with the result that the error in the memory elements Spi 10$i$, which corrupts at most k bits, is correctly corrected. Despite the considered error, the corrected value y=1 is thus also output in the second clock half, even though up to k memory elements assume an incorrect value in the second clock half.

If N=n for example, the combinational circuit 1011 can be easily implemented by directly combining the N=n outputs of the memory elements Spi, i=1, ..., N, which carry the signal yi, with the corresponding inputs of the n-input correction element 1012, with the result that zi=yi for i=1, ..., n and k=n−1, which corresponds to the example embodiment in FIG. 3. In this case, n−1 errors can thus be corrected in the second clock half during output from the memory elements.

A memory apparatus can be constructed from memory element arrangements, as explained above. FIG. 10 schematically illustrates a corresponding example embodiment. The memory apparatus in FIG. 10 comprises a memory 1110 comprising a multiplicity of memory element arrangements 111-119 which may each be conFig.d according to one of the example embodiments described above, for example. These memory element arrangements may be arranged in the form of a matrix, for example, as illustrated, but any other arrangement, in particular conventional arrangements of memory elements in a memory, is also possible. A memory controller 1111 can be used to access the memory 1110 via a bus, for example, as illustrated by an arrow 1112.

The above example embodiments should only be understood as an example. For example, new example embodiments can be created by means of simple equivalent substitutions of logic arrangements illustrated, without departing from the scope of the disclosure. For instance, in the circuit arrangement from FIG. 7B, the outputs of the memory elements SpM1 83, SpS1 86, SpM2 84 and SpS2 87 may each be negated or negated memory outputs may be used and the OR gate 85 may be replaced with a NAND gate without the function of the circuit arrangement being changed, in particular with regard to the properties of correcting one-bit, two-bit and three-bit errors.

It is also possible, for example, to combine two lines, which are directly connected to inputs of the n-input correction element in example embodiments, both by means of an AND gate and by means of an OR gate and, instead of the two lines, to even connect the output of the AND gate and the output of the OR gate to the corresponding inputs of the n-input correction element, without the properties of correcting one-bit, two-bit and three-bit errors being changed.

These examples are only some of the possible modifications. In particular, inverted signals and accordingly adapted logic circuits can generally be used.

The invention claimed is:
1. A memory element arrangement for storing a data value, comprising:
N memory elements, wherein N is an integer, and wherein N≥3;
a data input configured to supply the data value to each of the memory elements; and an error correction device having one output and at least three inputs, wherein an output of each of at least three of the N memory elements is coupled to a respective one of the inputs of the error correction device, and wherein the error correction device is configured, when all of the at least three memory elements output values identical to one another at their respective outputs, to provide a value identical to the values output by the memory elements at the output of the error correction device and, in at least one state which is independent of a value previously output at the output of the error correction device and in which all the memory elements do not output values identical to one another at their respective outputs, to retain the value previously output independently of the values output by the at least three memory elements.

2. The memory element arrangement as claimed in claim 1, wherein the error correction device comprises an n-input correction element with n inputs and one output, where n is an integer and wherein n≥3, wherein the inputs of the error correction device are coupled to respective inputs of the n-input correction element, and wherein the n-input correction element is configured to, when all data values present at its n inputs match, output the data value at the output of the n-input correction element and, when not all data values present at the n inputs of the n-input correction element are the same, a data value previously output at the output of the n-input correction element is retained.

3. The memory element arrangement as claimed in claim 2, wherein n=N, and wherein the output of each of the at least three memory elements is coupled to a respectively associated input of the n-input correction element.

4. The memory element arrangement as claimed in claim 2, wherein n<N.

5. The memory element arrangement as claimed in claim 4, wherein the error correction device further comprises a logic gate, and outputs of at least two of the memory elements are connected to associated inputs of the logic gate, and wherein an output of the logic gate is connected to an input of the n-input correction element.

6. The memory element arrangement as claimed in claim 5, wherein the logic gate is configured to implement a two-digit Boolean function g, for which $g(0,0) \neq g(1,1)$ and $g(0,1)=g(1,0)$, wherein 1 and 0 are two possible states of an output value of one memory element of the memory elements.

7. The memory element arrangement as claimed in claim 6, wherein the Boolean function is formed from a combination of one or more of an AND function, a NAND function, an OR function and a NOR function.

8. The memory element arrangement as claimed in claim 4, further comprising a logic circuit with N inputs and n outputs, wherein each of the inputs of the logic circuit are coupled to a respective output of one of the memory elements and each of the outputs of the logic circuit are coupled to an associated input of the n-input correction element.

9. The memory element arrangement as claimed in claim 8, wherein at least one of the outputs of the logic circuit is connected to the respectively associated input of the n-input correction element via a delay element.

10. The memory element arrangement as claimed in claim 9, wherein N≥4, and wherein the at least four memory elements form a first master/slave flip-flop and a second master/slave flip-flop each with a memory element configured as a master latch and a memory element configured as a slave latch, wherein an output of the slave latch of the first master/slave flip-flop is connected to a first input of the n-input correction element, wherein an output of the slave latch of the second master/slave flip-flop is connected to a second input of the n-input correction element, wherein an output of the master latch of the first master/slave flip-flop is coupled to a first input of a logic gate, the logic gate having at least two inputs and one output, wherein an output of the master latch of the second master/slave flip-flop is connected to a second input of the logic gate, and wherein the output of the logic gate is coupled to a third input of the n-input correction element.

11. The memory element arrangement as claimed in claim 10, wherein n=3 and N=4.

12. The memory element arrangement as claimed in claim 10, further comprising a delay element arranged between the logic gate and the n-input correction element.

13. The memory element arrangement as claimed in claim 1, wherein the N memory elements comprise at least one master-slave pair that comprises at least one master memory element and at least one slave memory element associated with the at least one master memory element.

14. The memory element arrangement as claimed in claim 13, wherein the at least one master memory element comprises one master memory element, and the at least one slave memory element comprises a first slave memory element and a second slave memory element, wherein an output of the master memory element is connected to an input of the first slave memory element, to an input of the second slave memory element and to a first input of the n-input correction element, wherein an output of the first slave memory element is connected to a second input of the n-input correction element, and wherein an output of the second slave memory element is connected to a third input of the n-input correction element.

15. The memory element arrangement as claimed in claim 14, wherein the output of the master memory element is connected to the first input of the n-input correction element via a delay element.

16. The memory element arrangement as claimed in claim 14, where n=3.

17. The memory element arrangement as claimed in claim 1, further comprising at least one delay element connected downstream of at least one of the memory elements, wherein the delay element is configured to synchronize output signals from the memory elements.

18. A memory apparatus, comprising:

a memory having a plurality of memory element arrangements, wherein at least one of the memory element arrangements comprises:

N memory elements, wherein N is an integer, and wherein N≥3;

a data input configured to supply the data value to each of the memory elements; and an error correction device having one output and at least three inputs, wherein an output of each of at least three of the N memory elements is coupled to a respective one of the inputs of the error correction device, and wherein the error correction device is configured, when all of the at least three memory elements output values identical to one another at their respective outputs, to provide a value identical to the values output by the memory elements at the output of the error correction device and, in at least one state which is independent of a value previously output at the output of the error correction device and in which all the memory elements do not output values identical to one another at their respective outputs, to retain the value previously output independently of the values output by the at least three memory elements; and a memory controller configured to write data to the memory and read data from the memory.

19. A method, comprising:

writing a data value to at least three memory elements;

reading the data values from the at least three memory elements; and outputting a corrected data value based on the read data values such that, when the read data values match, the matching data value is output and, in at least one state which is independent of a value previously output at the output of an error correction device and in which the data values do not match, a previously read data value is output independently of the values read from the at least three memory elements.

20. The method as claimed in claim 19, wherein a previously read data value is output in each state in which the data values do not match.

21. The method as claimed in claim 19, further comprising:
combining at least two of the data values with a logic function in order to form a combined data value; and
outputting a previously read data value if the data values which have not been combined with the logic function and the combined data value do not all have the same value.

22. The method as claimed in claim 19, wherein the corrected data value is output while the memory elements are in a waiting state.

* * * * *